US007094062B2

(12) United States Patent
Ramey et al.

(10) Patent No.: US 7,094,062 B2
(45) Date of Patent: Aug. 22, 2006

(54) LAND GRID ARRAY CONNECTOR

(75) Inventors: Samuel C. Ramey, Naperville, IL (US); Lily T. C. Chang, Lisle, IL (US); Yew Teck Yap, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/626,223

(22) Filed: Jul. 24, 2003

(65) Prior Publication Data

US 2005/0020098 A1      Jan. 27, 2005

(51) Int. Cl.
  *H01R 12/00*      (2006.01)
(52) U.S. Cl. ............................. 439/66; 439/862
(58) Field of Classification Search .................. 439/66, 439/71, 342, 65, 629, 862, 636
  See application file for complete search history.

(56) References Cited

U.S. PATENT DOCUMENTS

| 5,653,598 | A | 8/1997 | Grabbe | |
|---|---|---|---|---|
| 5,820,389 | A | 10/1998 | Hashiguchi | |
| 6,186,797 | B1 * | 2/2001 | Wang et al. | 439/66 |
| 6,210,176 | B1 | 4/2001 | Hsiao | |
| 6,315,621 | B1 * | 11/2001 | Natori et al. | 439/862 |
| 6,406,305 | B1 * | 6/2002 | Wu | 439/65 |
| 6,585,527 | B1 * | 7/2003 | Koopman et al. | 439/71 |
| 6,652,329 | B1 * | 11/2003 | Howell et al. | 439/862 |
| 6,674,018 | B1 * | 1/2004 | Yumi | 174/267 |
| 6,688,893 | B1 * | 2/2004 | Huang et al. | 439/66 |
| 6,695,624 | B1 * | 2/2004 | Szu | 439/66 |
| 6,921,270 | B1 * | 7/2005 | Mendenhall et al. | 439/66 |

FOREIGN PATENT DOCUMENTS

WO      WO 03/049517 A1      6/2003

OTHER PUBLICATIONS

International Search Report and Written Opinion of International Searching Authority.

* cited by examiner

Primary Examiner—Tulsidas C. Patel
Assistant Examiner—Phuongchi Nguyen
(74) Attorney, Agent, or Firm—Robert J. Zeiter

(57) ABSTRACT

A land grid array connector includes a housing having a plurality of passageways therethrough and a conductive contact provided in each passageway. A recess is formed in each passageway. Each contact has a deformable portion having a tip provided at an end thereof. The deformable portion is capable being in an undeformed position and in a deformed position. When a lateral force is placed on the deformable portion of each contact, at least a portion of the tip is maintained within the recess. The recess is sized and configured to limit lateral deflection of the tip upon deformation of the deformable portion in a lateral direction.

17 Claims, 4 Drawing Sheets

LAND GRID ARRAY CONNECTOR

FIELD OF THE INVENTION

The present invention relates to a land grid array connector having a conductive contact and a housing with a recess therein for protecting a tip of the conductive contact.

BACKGROUND OF THE INVENTION

Land grid array connectors are commonly used with integrated circuits. Conventional land grid array connectors include an insulative housing which defines a plurality of passageways therethrough, and a plurality of conductive contacts received in the passageways. The land grid array connector is connected to an integrated circuit which has a plurality of flat contact pads formed on a bottom surface thereof to which the contacts are electrically mated.

A mating component, such as a printed circuit board, a plate having a contact pad thereon, or an integrated circuit package, is typically mated with the land grid array connector by lowering the mating component onto the land grid array connector such that the conductive contacts are compressed within the housing.

Problems can occur, however, when the mating component is mated with the land grid array connector. For instance, if the mating component contacts the conductive contacts without an equal force across the entire land grid array connector, lateral forces can be placed on some or all of the conductive contacts such that the conductive contacts can plastically deform. Such a situation could damage the land grid array connector such that replacement of the connector would be necessary. Such a situation could further affect the desired signal transmission.

Thus, there is a need for a land grid array connector which overcomes the disadvantages of prior art land grid array connectors. The present invention provides such a land grid array connector. Features and advantages of the present invention will become apparent upon a reading of the attached specification, in combination with a study of the drawings.

OBJECTS AND SUMMARY OF THE INVENTION

The primary object of the present invention is to provide a land grid array connector which protects a conductive contact mounted therein from plastically deforming upon the application of a lateral force to the conductive contact.

An object of the present invention is to provide a land grid array connector which has a contact having a shape that minimizes translation when a force is placed on the contact.

Yet another object of the present invention is to provide a land grid array connector which has an enlarged portion on the tip which serves as a guide and provides for a more robust contact than prior art contacts.

Yet a further object of the present invention is to provide a high-density connector.

Another object of the present invention is to provide a land grid array connector which can be economically manufactured.

Briefly, and in accordance with the foregoing, the present invention provides a land grid array connector. The land grid array connector includes a housing having a plurality of passageways therethrough and a conductive contact provided in each passageway. A recess is formed in each passageway. Each contact has a deformable portion having a tip provided at an end thereof. The deformable portion is capable being in an undeformed position and in a deformed position. When a lateral force is placed on the deformable portion of each contact, at least a portion of the tip is maintained within the recess. The recess is sized and configured to limit lateral deflection of the tip upon deformation of the deformable portion in a lateral direction.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

Figure 1:
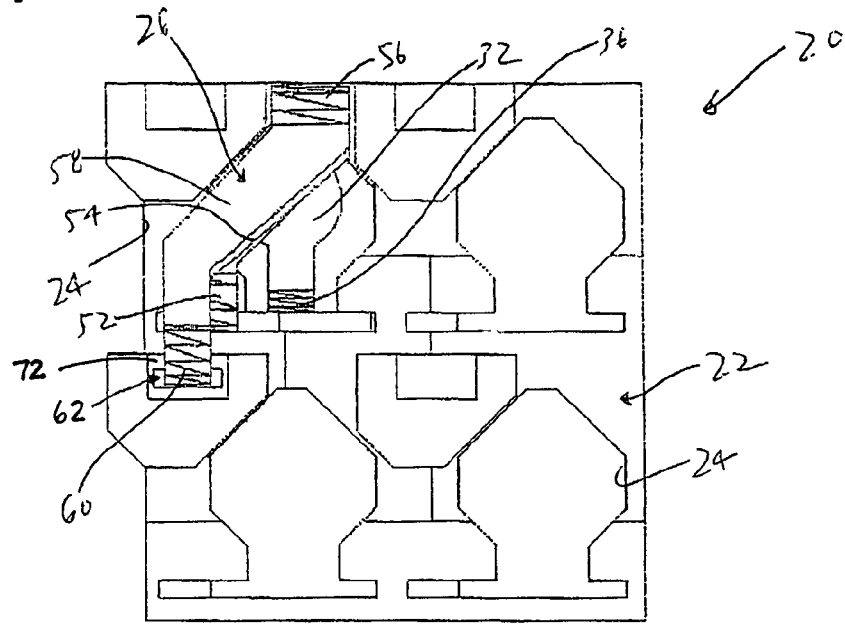
FIG. 1 is top elevational view of land grid array connector which incorporates the features of the invention, such land grid array being shown with a single contact provided therein.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated.

The present invention provides a land grid array connector 20. The land grid array connector 20 is formed from an insulative housing 22 which has a plurality of passageways 24 provided therethrough and a conductive contact 26 mounted in respective passageways 24. The contacts 26 are mounted in the housing 22 such that a high-density configuration is provided. The contacts 26 are protected by the housing 22 from damage when a lateral force is applied to the contact 26.

Figure 4:
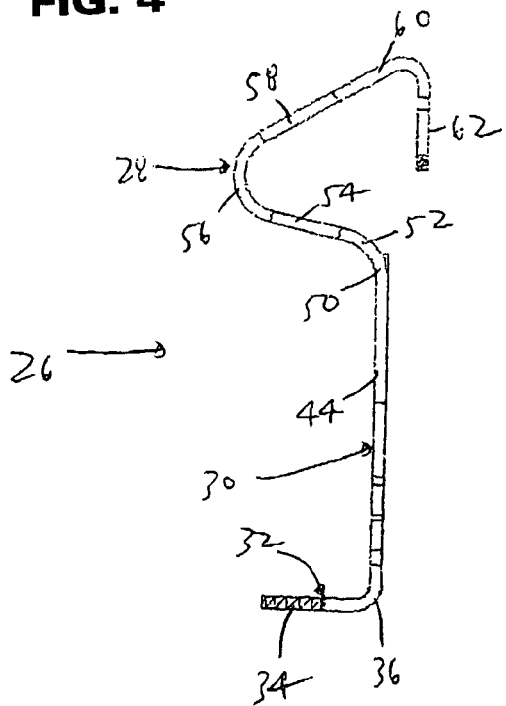
FIG. 4 is a side elevational view of the contact.
Figure 5:
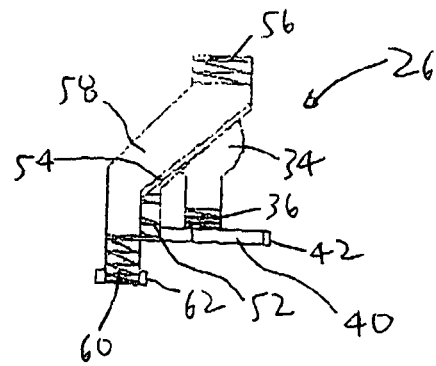
FIG. 5 is a top elevational view of the contact.
Figure 6:
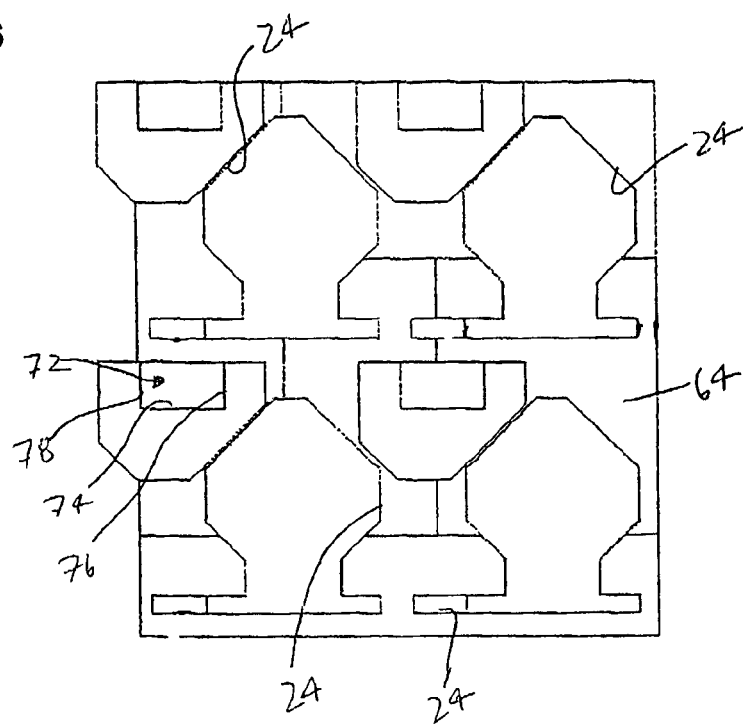
FIG. 6 is a top elevational view of a portion of the housing.
Figure 7:
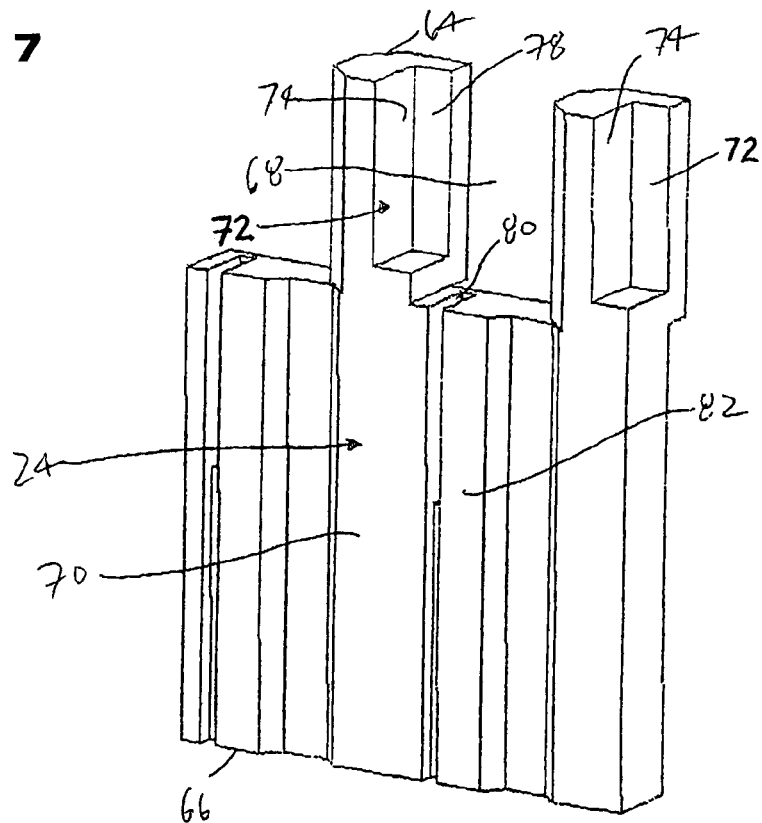
FIG. 7 is a cross-sectional view of the housing.

The structure of one of the contacts 26 is described herein with the understanding that the other contacts 26 are identically formed. The contact 26 is formed from a conductive material, such as metal, and can be formed by stamping and forming. As such, the contact 26 can be economically manufactured. The contact 26 is formed in generally an "S" shape as shown in FIG. 4. The contact 26 includes a first or upper portion 28, a second or middle portion 30 and a third or lower portion 32. The upper portion 28 can be deformed relative to the middle and lower portions 30, 32 such that the upper portion 28 can move vertically or laterally relative to the middle and lower portions 30, 32. The "S" shape of the contact 26 minimizes translation of the contact 26 when a vertical or lateral force is placed thereon.

The lower portion 32 is formed from a contact pad 34 which is flat and has an enlarged area for contacting a mating component 35, such as a solder ball. As shown, the contact pad 34 is circular, however, it is to be understood that the contact pad 34 can take any desired shape and need not be flat. The lower portion 32 is provided at approximately the midpoint of the width of the middle portion 30.

The middle portion 30 is generally perpendicular to the lower portion 32 and is connected thereto by a curved portion 36. The middle portion 30 is flat and is generally rectangular in shape such that a lower edge 38, an upper edge 40, a first side edge 42 and a second side edge 44 is provided. The middle portion 30 has a predetermined height and width. A notch 46 is provided in the upper edge 40 of the middle portion 30 which separates the upper end of the middle portion 30 into a first section 48 and a second section 50 along the width of the middle portion 30. The second section 50 of the middle portion 30 is connected to the upper portion 28.

Figure 2:
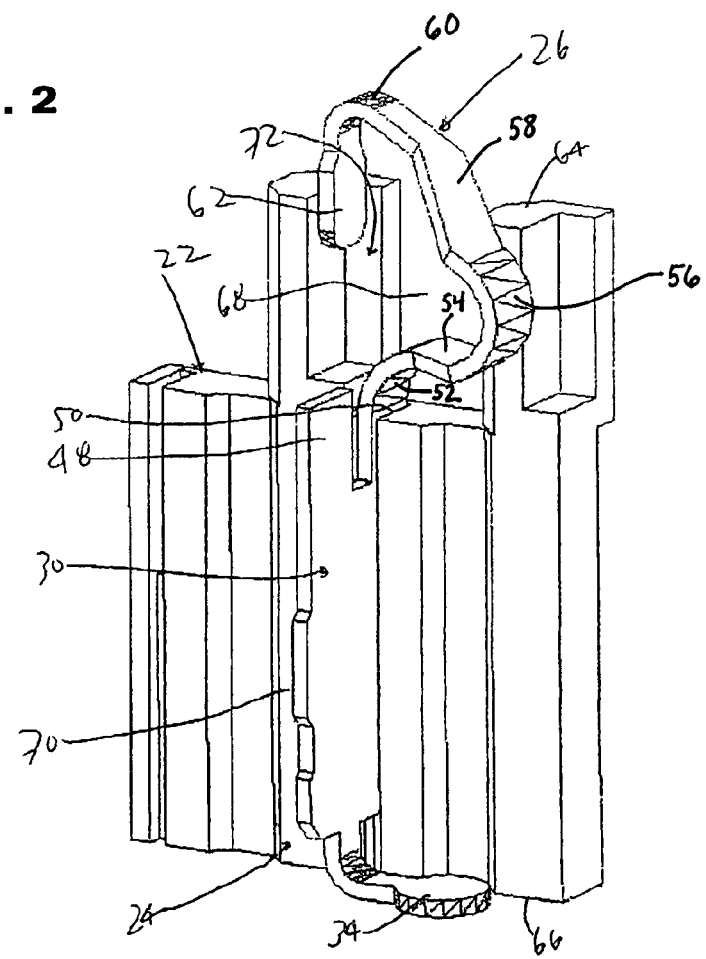
FIG. 2 is a perspective view of a portion of the housing and a contact provided therein, the housing being cut-away to show the contact.
Figure 3:
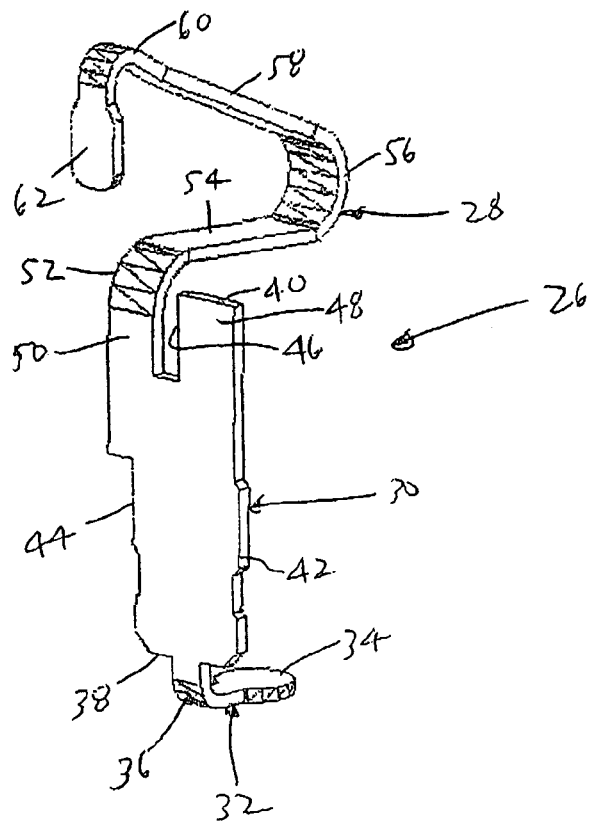
FIG. 3 is perspective view of the contact.

The upper portion 28 of the contact is formed by a first part 52 which extends from the first section 50, a second part 54 which extends from the first part 52, a third part 56 which extends from the second part 54, a fourth part 58 which extends from the third part 56, a fifth part 60 which extends from the fourth part 58, and a sixth part 62 which extends from the fifth part 60. The first part 52 curves upwardly from the first section 50 and extends in the same direction as the lower portion 32 of the contact 26. The second part 54 extends upwardly from the first part 52 and is angled relative to the horizontal as shown in FIG. 4. In addition, the second part 54 angles relative to the vertical toward the first side 42 of the middle portion as is most clearly shown in FIG. 5. The third part 56 is generally U-shaped. The fourth part 58 extends upwardly from the third part 56 and is angled relative to the horizontal as shown in FIG. 4. In addition, the fourth part 58 angles relative to the vertical toward the second side 44 of the middle portion 30 as is most clearly shown in FIG. 5. The fifth part 60 is generally L-shaped. The sixth part 62 extends downwardly from the fifth part 60 toward the top edge 40 of the middle portion 30. When the contact 26 is not deformed as shown in FIGS. 2–5 and 8, the sixth part 62 is generally parallel to the middle portion 30, but in a plane offset from the plane containing the middle, or fixed portion, of the contact 26. As is best illustrated in FIG. 2, the width of the first, second and third parts 52, 54, 56 is consistent along their lengths; the width of the fourth part 58 along its length tapers downwardly from the third part 56 to the fifth part 60; and the width of the fifth part 60 is consistent along its length. The sixth part 62 has a width that is wider than the fifth part 60 such that an enlarged tip is formed relative to the fifth part 60. The fifth part 60 is the portion of the contact 26 which will be in contact with the mating component, such as a contact pad on a printed circuit board 63. The upper portion 28 of the contact 26 can be deformed relative to the middle and lower portions 30, 32 by applying a downward force to the fifth part 60 of the upper portion 28.

The housing 22 is formed of an insulative material, such as a plastic, and can be formed by molding. As such, the housing 22 can be economically manufactured. The housing 22 has a top or first surface 64 and a bottom or second surface 66. The passageways 24 extend from the top surface 64 to the bottom surface 66 of the housing 22. The structure of one of the passageways 24 is described herein with the understanding that the other passageways 24 are identically formed. The passageway 24 is formed from a first or upper portion 68 which extends downwardly from the top surface 64 of the housing 22 and a second or lower portion 70 which extends from the upper portion 68 to the bottom surface 66 of the housing 22.

Figure 8:
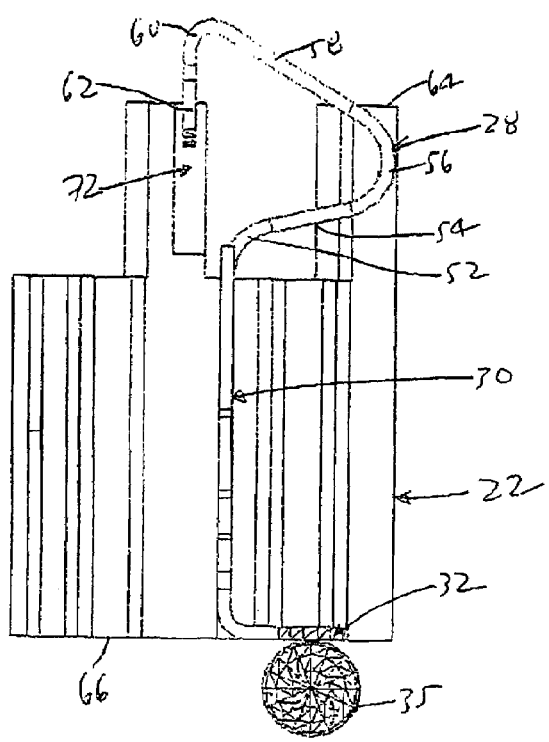
FIG. 8 is a cross-sectional view of the housing with the contact being shown in side elevation and in an undeformed condition and showing a mating component in contact with the contact.

As shown in FIG. 2, the contact 26 is mounted in the passageway 24 such that the lower and middle portions 30, 32 of the contact 26 are in the lower portion 70 of the passageway 24 and the upper portion 28 of the contact 26 is in the upper portion 68 of the passageway 24. The contact pad 34 is preferably flush with the bottom surface 66 of the housing 22. In the undeformed position as shown in FIGS. 2 and 8, the fourth and fifth parts 58, 60 and a portion of the tip 62 of the contact 26 extend upwardly from the top surface 64 of the housing 22; and the remainder of the tip 62 is provided within the passageway 24.

Figure 9:
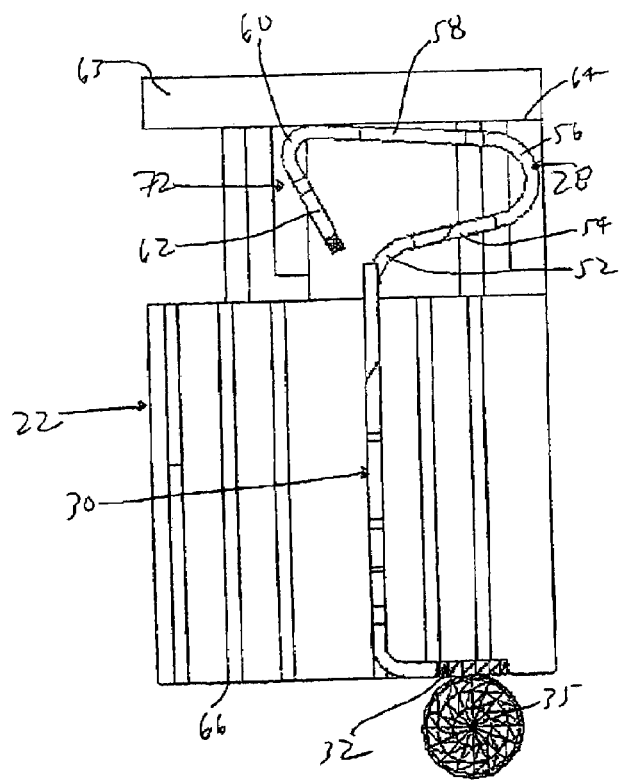
FIG. 9 is a cross-sectional view of the housing with the contact being shown in side elevation and in a deformed condition and showing mating components in contact with the contact.

The upper portion 68 of the passageway 24 has a predetermined height, width and depth. The height, width and depth of the upper portion 68 is such that it accommodates the upper portion 28 of the contact 26 therein when the upper portion 28 is deformed such that the fifth portion 60 is flush with the top surface 64 of the housing 22 as shown in FIG. 9. The width and depth of the upper portion 28 is dimensioned such that it accommodates the first through fifth parts 52, 54, 56, 58, 60, 62. A recess 72 is provided in the upper portion 68 of the passageway 24 in which the sixth part or tip 62 is provided. The recess 72 has a first wall 74 which is generally parallel to the tip 62 when the contact 26 is in an undeformed position, and second and third walls 76, 78 which are perpendicular to the first wall 74 and connected to the first wall 74 at opposite ends thereof. The recess 72 opens into the remainder of the upper portion 68. The recess 72 is dimensioned such that width is slightly larger than the width of the tip 62 as is best illustrated in FIG. 1. The provision of the enlarged tip 62 allows the housing 22 to be more economically manufactured because the enlarged area of the recess 72 allow for easier molding of the passageways 24.

The lower portion 70 of the passageway 24 has a first section 80 and a second section 82. The first section 80 has a height and depth that are dimensioned to generally correspond to the height and width of the second section 50 of the middle portion 30 of the contact 26 such that the second section 50 is captured and held within the first section 80 of the passageway 24. The second section 82 is dimensioned such that it has a height which generally corresponds to the height of the vertical leg of the curved portion 36 and the middle portion 30 and is dimensioned such that it has a depth which generally corresponds to the length of the lower portion 32 of the contact 26. Suitable means for securing the contact 26 and the housing 22 are provided.

As discussed, when the contact 26 is in the undeformed position as shown in FIG. 2-5 and 8, the fourth and fifth parts 58, 60 and a portion of tip 62 of the contact 26 extend upwardly from the top surface 64 of the housing 22; and the remainder of the tip 62 is provided within the recess 72. When a downward force is placed on the contact 26 by a mating component 63 contacting the fifth part 60 of the contact 26, the upper portion 28 deforms relative to the middle and lower portions 30, 32 as is shown in FIG. 9. The upper portion 28 will deform until the fifth part 60 is flush with the upper surface 64 of the housing 22. If the force on the fifth part 60 is directly downward, the upper portion 28 of the contact 26 only moves vertically and does not move laterally. If, however, the force on the fifth part 60 is not directly downward and is slightly angled relative to the vertical, the upper portion 28 of the contact 26 will move laterally. In this situation, the recess 72 prevents the plastic deformation of the contact 26 while allowing for elastic deformation of the contact 26. When a force that is angled relative to the vertical is placed on the contact 26, the tip 62 will move laterally within the recess 72 until the tip 62 contacts one of the side walls 76, 78 of the recess 72. Thus, the tip 62 acts as a guide. The contact of the tip 62 with the wall 76, 78 prevents the tip 62 will from moving laterally further. As a result of this construction, the upper portion 28 can move laterally a predetermined amount, but is prevented from moving laterally to the extent that plastic deformation of the contact 26 would occur. In addition, because the tip 62 is enlarged relative to the fourth part 60 which is the portion that contacts the mating component 63, a more robust contact is provided because the tip 62 can more readily absorb the impact with the walls 76, 78 of the recess 72 without deformation.

It is to be understood that the structure of the contact 26 described herein is illustrative of one of many types of contacts that could be provided.

While a preferred embodiment of the invention is shown and described, it is envisioned that those skilled in the art may devise various modifications without departing from the spirit and scope of the foregoing description and the appended claims.

The invention claimed is:

1. A land grid array connector comprising:
   a housing having a first surface and a second surface, the housing having a passageway provided therethrough which extends from the first surface to the second surface, the passageway having a recess proximate to the first surface of the housing; and
   a conductive contact received within the passageway, the contact having a deformable portion having a tip provided at an end thereof, the deformable portion being capable being in an undeformed position and in a deformed position, at least a portion of the tip being provided within the recess when the contact is in an undeformed position, at least a portion of the tip being provided within the recess when a lateral force is placed on the contact to deform the deformable portion, the recess being sized and configured to limit lateral deflection of the tip upon deformation of the deformable portion in a lateral direction.

2. A land grid array connector as defined in claim 1, wherein the contact has a thickness of approximately 0.003 inches.

3. A land grid array connector as defined in claim 1, wherein each contact includes a deformable portion and a fixed portion, the deformable portion being laterally offset from the fixed portion.

4. A land grid array connector as defined in claim 1, wherein the tip of the deformable portion has enlarged portion having a predetermined width.

5. A land grid array as defined in claim 4, wherein the recess has a width that is slightly larger than the width of the enlarged portion.

6. A land grid array connector as defined in claim 1, wherein the tip is provided at a first end of the contact, and a contact pad is provided at a second end of the contact.

7. A land grid array as defined in claim 6, wherein the contact pad is flat and flush with the second surface of the housing.

8. A land grid array connector as defined in claim 1, wherein the contact is generally S-shaped.

9. A land grid array connector as defined in claim 8, wherein the tip of the deformable portion has an enlarged portion.

10. A land grid array connector as defined in claim 1, wherein a plurality of passageways in the housing and a plurality of contacts are provided, respective ones of the contacts being mounted within respective ones of the passageways.

11. A land grid array connector as defined in claim 10, wherein the passageways and the contacts are provided in the housing in a high-density arrangement.

12. A land grid array connector as defined in claim 10, wherein each the tip has enlarged portion having a predetermined width.

13. A land grid array as defined in claim 12, wherein each the recess has a width that is slightly larger than the width of respective ones of the enlarged portions.

14. A land grid array connector as defined in claim 10, wherein each the tip is provided at a first end of the respective contact, and a contact pad is provided at a second end of the respective contact.

15. A land grid array as defined in claim 14, wherein each the contact pad is flat and flush with the second surface of the housing.

16. A land grid array connector as defined in claim 10, wherein each the contact is generally S-shaped.

17. A land grid array connector as defined in claim 16, wherein each the tip has an enlarged portion.

* * * * *